United States Patent [19]
Liang et al.

[11] Patent Number: 5,796,135
[45] Date of Patent: Aug. 18, 1998

[54] PROCESS TO FABRICATE STACKED CAPACITOR DRAM AND LOW POWER THIN FILM TRANSISTOR SRAM DEVICES ON A SINGLE SEMICONDUCTOR CHIP

[75] Inventors: Mong-Song Liang; Shou-Gwo Wuu; Chen-Jong Wang; Chung-Hui Su, all of Hsin-Chu, Taiwan

[73] Assignee: Taiwan Semiconductor Manufacturing Company, Ltd., Hsin-Chu, Taiwan

[21] Appl. No.: 960,142

[22] Filed: Oct. 29, 1997

Related U.S. Application Data

[62] Division of Ser. No. 623,243, Mar. 28, 1996, Pat. No. 5,716,881.

[51] Int. Cl.[6] .......... H01L 27/108; H01L 29/76; H01L 29/94; H01L 31/119
[52] U.S. Cl. .......... 257/296; 257/903; 365/154
[58] Field of Search .......... 257/296, 903, 257/904

[56] References Cited

U.S. PATENT DOCUMENTS

| | | | |
|---|---|---|---|
| 5,572,461 | 11/1996 | Gonzalez | 365/156 |
| 5,640,342 | 6/1997 | Gonzalez | 365/156 |
| 5,702,988 | 12/1997 | Liang | 438/238 |

*Primary Examiner*—Olik Chaudhuri
*Assistant Examiner*—Howard Weiss
*Attorney, Agent, or Firm*—George O. Saile; Stephen B. Ackerman

[57] ABSTRACT

A fabrication process for integrating stacked capacitor, DRAM devices, and thin film transistor, SRAM devices, has been developed. The fabrication process features combining key operations used to create transfer gate transistor structures, and access transistor structures for the DRAM and SRAM devices. In addition, process steps, used to create a capacitor structure, for the DRAM device, and a thin film transistor structure, for the SRAM device, are also shared. Another key feature of this invention is a buried contact structure, used for the SRAM device.

6 Claims, 17 Drawing Sheets

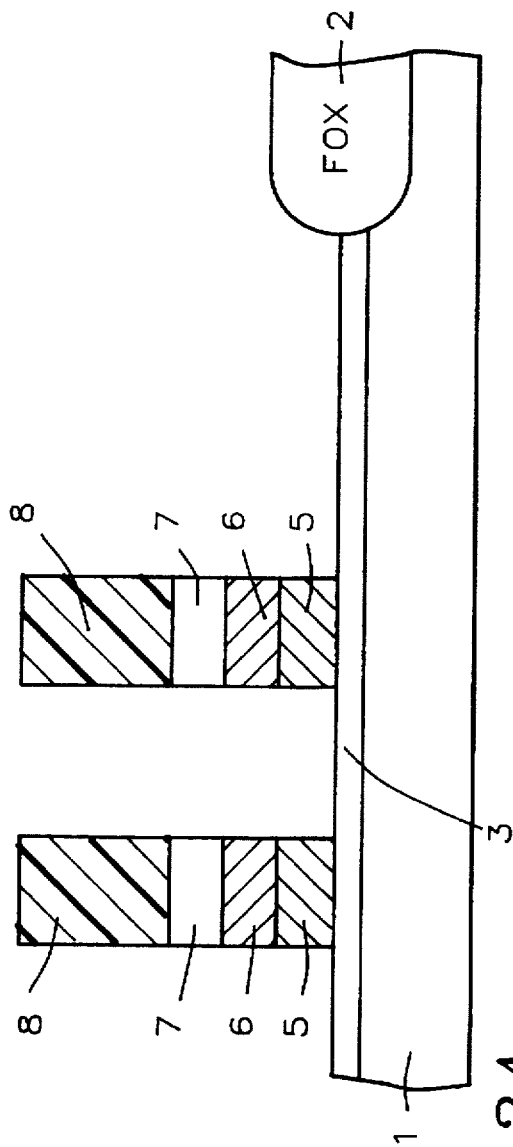
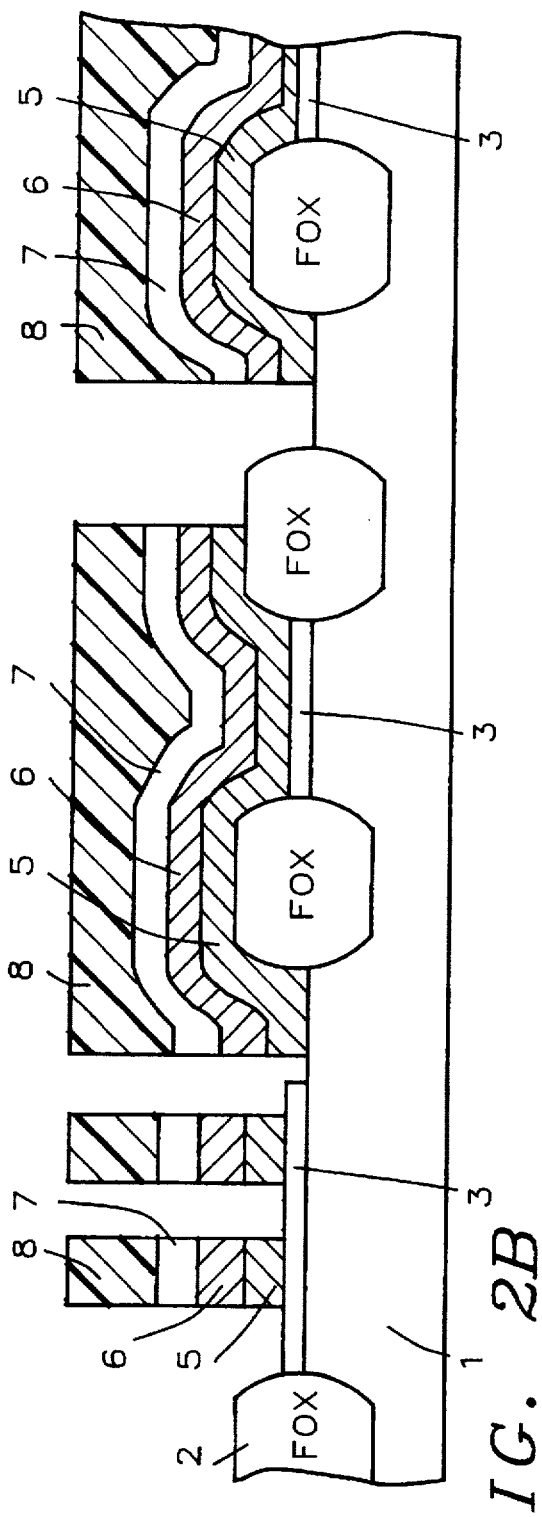
FIG. 2A
FIG. 2B

PROCESS TO FABRICATE STACKED CAPACITOR DRAM AND LOW POWER THIN FILM TRANSISTOR SRAM DEVICES ON A SINGLE SEMICONDUCTOR CHIP

This is a division of patent application Ser. No. 08/623, 243, filing date Mar. 28, 1996 now U.S. Pat. No. 5,716,881. Process To Fabricate Stacked Capacitor Dram And Low Power Thin Film Transistor Sram Devices On A Single Semiconductor Chip, assigned to the same assignee as the present invention.

BACKGROUND OF THE INVENTION

(1) Field of the Invention

This present invention relates to the fabrication of semiconductor devices, and more specifically to fabrication processes used to integrate memory and logic devices on the same semiconductor chip.

(2) Description of Prior Art

Two basic types of devices, manufactured by the semiconductor industry, are logic and memory. Logic devices are used to process information or data, while memory device are used for storage of information or data. These two types of devices are found in all computers, however each is manufactured on a specific chip, used either for logic or memory. In the past it had been difficult to blend, or integrate both types of devices on a single semiconductor chip. Semiconductor fabrication processes used for each specific device type had unique features, and thus unique process steps. This forced the semiconductor process community to use a complex, lengthy and costly process sequence, in an attempt to integrate both logic and memory devices on a single semiconductor chip.

If a less difficult process for integrating the two types of devices can not be realized, the consequence will be ultimately be observed in system performance and cost. In systems where logic and memory functions are packaged separately, data signals between the two may have to pass through several levels of wiring, boards, pins, etc., all of which result in undesirable propagation delays. In addition to the performance degradation, resulting from separating logic and memory applications, at the semiconductor chip level, the cost of having to fabricate silicon wafers, with a unique fabrication process, directed at the logic device, and to then fabricate additional wafers, again with unique processing, directed at the memory device, is significantly greater then the cost of producing both devices, on the same silicon wafer. Therefore efforts for integrating, or blending memory and logic devices on the same semiconductor chip have been increasing. One example of blending technologies is the formation of both bipolar and complimentary metal oxide semiconductor, (CMOS), device structures on the same chip, disclosed by Takemoto, et al, in U.S. Pat. No. 5,066,602, and by Vora, et al, in U.S. Pat. No. 5,340,762. However a process for blending memory devices, and CMOS logic devices is not discussed. This invention will describe a novel, semiconductor process sequence, used to integrate stacked capacitor, dynamic random access memory, (DRAM), memory devices, with thin film transistor, (TFT), static random access memory, (SRAM), devices, used for logic applications.

SUMMARY OF THE INVENTION

It is an object of this invention to provide a semiconductor fabrication process for forming memory and logic devices on the same semiconductor chip.

It is another object of this invention to fabricate a stacked capacitor, DRAM device, and a thin film transistor, SRAM device, using identical processing steps to produce the stacked capacitor portion, of the DRAM device, and the thin film transistor portion, of the SRAM device.

It is yet another object of this invention to fabricate a stacked capacitor, DRAM device, and a thin film transistor, SRAM device, using identical processing steps to produce the transfer gate transistor portion, of the DRAM device, and the access transistor portion, of the SRAM device.

In accordance with the present invention a process is described allowing DRAM and SRAM devices to be formed on a single semiconductor chip, using a integrated process sequence. After field oxide formation, for purposes of device isolation, the transfer gate transistor, of the DRAM device, and the access transistor, of the SRAM device, are simultaneously formed via growing a thermal gate oxide, depositing and doping a first polysilicon layer, depositing a silicide layer, and depositing an insulator layer. Photolithographic, and reactive ion etching procedures produce a first polycide, (silicide-polysilicon), gate structure, for the transfer gate transistor, of the DRAM device, and for the access transistor, of the SRAM device. The identical first polycide gate structure is also produced for a buried contact structure, of the SRAM device, with a portion of the first polycide gate structure contacting the underlying semiconductor substrate. Ion implantation processes are used to produce lightly doped source and regions, between the first polycide gate structures, of the DRAM and SRAM devices. Insulator sidewall spacers are created, on the sides of the first polycide gate structures, by depositing an insulator, and using an anisotropic, reactive ion etching process to remove the insulator from all areas except from the sides of the first polycide gate structures. Another ion implantation process is employed to create heavily doped source and drain regions, between the insulator sidewalled, first polycide gate structures. Another layer of insulator is deposited, followed by photolithographic and reactive ion etching, used to open a region in the insulator, between the first polycide gate structures of the DRAM device, and between first polycide gate structures of the SRAM device, again exposing the semiconductor substrate. A second polysilicon layer is deposited, doped, and followed by the deposition of another silicide layer. Photolithographic and reactive ion etching procedures are used to create an overlying, second polycide gate structure, self aligned to, and contacting the underlying semiconductor substrate, in areas between the DRAM, transfer gate transistor, and for the SRAM, access transistor. Another insulator is deposited and planarized via chemical mechanical polishing procedures. First contact holes are opened in the planarized insulator layer, to expose the first polycide gate structure, used for the buried contact structure, of the SRAM device. A third polysilicon deposition, completely filling the first contact holes, is performed, with the unwanted third polysilicon layer, on the field, removed via reactive ion etching procedures, forming a polysilicon plug in the first contact holes. High temperatures, experienced during previous, and subsequent processing procedures, will result in out diffusion of dopants from the second polycide gate structure, reaching the underlying semiconductor regions, interfacing the overlying second polycide gate structure, thus resulting in the creation of a buried contact structure. A second contact hole is opened, in the planarized insulator layer, to expose a heavily doped source and drain region of the DRAM device. A fourth polysilicon layer, used as a bottom capacitor electrode, is deposited and patterned to form a polysilicon capacitor electrode, on the sidewalls of the second contact hole, and planar polysilicon capacitor electrodes, overlying the polysilicon filled, first contact holes, of the SRAM device. A thin capacitor dielectric layer is next blanket deposited, and patterned to open holes in the capacitor dielectric, exposing the underlying planar polysilicon capacitor electrode, of the SRAM device. A fifth polysilicon layer, to be used as a top capacitor electrode, is deposited, and patterned to form a capacitor structure, in the second contact hole of the DRAM device, and patterned to form a planar capacitor structure, the thin film transistor, on the buried contact structure, of the SRAM device. Another insulator layer is deposited, and via holes opened to expose the top surface of the capacitor structure, in the second contact hole, and the top surface of the second polycide structure, of the DRAM device, while also exposing the top surface of the thin film transistor structure, and the top surface of the second polycide structure, of the SRAM device. Tungsten deposition, followed by removal of unwanted tungsten, result in tungsten plugs, in the via holes. Metallization, and patterning, result in metal contact structures, overlying the tungsten filled via holes.

BRIEF DESCRIPTION OF THE DRAWINGS

The object and other advantages of this invention are best described in the preferred embodiment with reference to the attached drawings that include:

FIGS. 1a–10a, which schematically, in cross-sectional style, illustrate the fabrication stages used to create the stacked capacitor, DRAM device structure.

FIGS. 1b–10b, which schematically, in cross-sectional style, illustrate the stages of fabrication used to create the thin film transistor, SRAM device structure.

DESCRIPTION OF THE PREFERRED EMBODIMENTS

The method of integrating stacked capacitor, DRAM device structures, and thin film transistor, SRAM device structures, on a single semiconductor chip, will now be covered in detail. This invention will describe a N type DRAM device, although a P type DRAM device can be easily substituted by creating an N well region, and using P type dopants for source and drain regions. In addition for the SRAM device, only an N channel transistor will be detailed. However for SRAM designs incorporating both N and P channel devices, the addition of the P channel device can easily be accomplished via the creation of an N well region, and routine photolithographic masking of non-P channel regions, followed by P type source and drain formation.

Figure 1A:
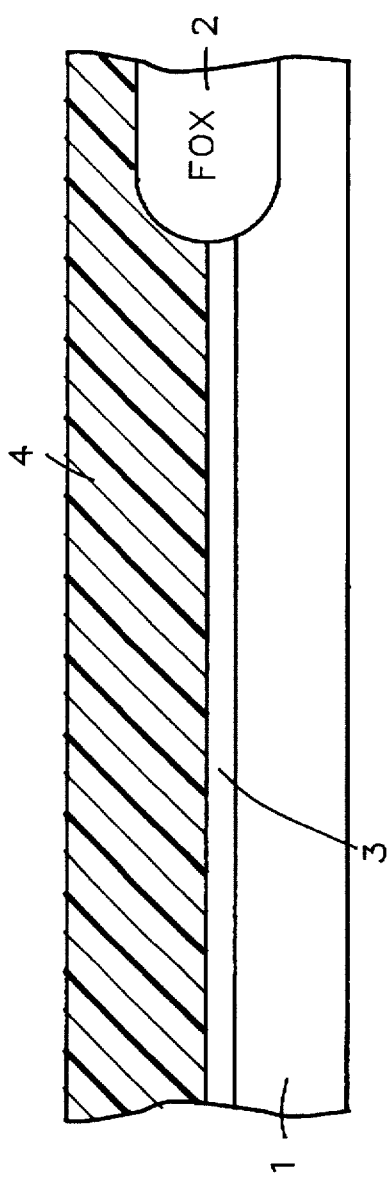
Figure 1B:
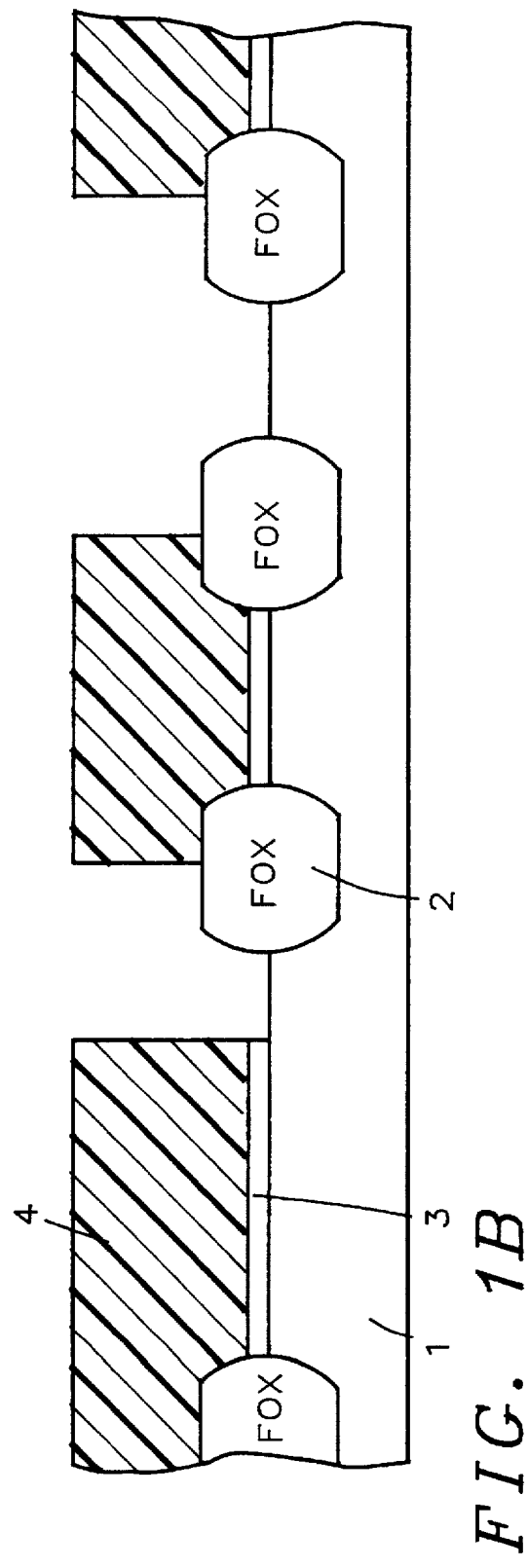

A P type, semiconductor substrate, 1, composed of single crystalline silicon, with a <100> crystallographic orientation, is used for both the stacked capacitor DRAM device structure, shown in FIG. 1a, as well as for the thin film transistor, SRAM, (TFT-SRAM), device structure, shown in FIG. 1b. Thick field oxide regions, 2, (FOX), are created for both DRAM and SRAM structures, via the use of a patterned, composite oxidation mask of silicon nitride, on silicon oxide, allowing the formation of FOX, 2, only in unmasked regions. Growth of FOX region, 2, is accomplished via thermal oxidation, in an oxygen steam ambient, at a temperature between about 850° to 1050° C., producing a silicon dioxide, FOX, thickness between about 3000 to 6000 Angstroms. After removal of the composite oxidation masking layers, via use of a hot phosphoric acid solution for the silicon nitride layer, and a buffered hydrofluoric acid solution for the underlying silicon oxide layer, a gate insulator of silicon dioxide, 3, is thermally grown, in non-FOX regions, using an oxygen-steam ambient, at a temperature between about 800° to 1000° C. to produce silicon dioxide, gate insulator, 3, at a thickness between about 60 to 200 Angstroms. This is shown for both the DRAM device structure, in FIG. 1a, and the SRAM device structure, shown schematically in FIG. 1b. A photolithographic masking layer, 4, is used as a mask to allow removal of gate insulator, silicon dioxide, 3, in regions of the SRAM device structure, that will be used for a subsequent buried contact region. Gate insulator, silicon dioxide, 3, is removed via use of a buffered hydrofluoric acid solution. This is shown schematically in FIG. 1b. Photoresist removal is performed using plasma oxygen ashing, and careful wet cleans.

FIG. 2a, and FIG. 2b, show the creation of a first polycide gate structure. A first layer of polysilicon, 5, is deposited using low pressure chemical vapor deposition, (LPCVD), processing, at a temperature between about 480° to 620° C., to a thickness between about 500 to 1500 Angstroms. The polysilicon can be grown intrinsically and doped via ion implantation of arsenic or phosphorous, at an energy between about 30 to 80 KeV, at a dose between about $5\times10^{13}$ to $5\times10^{15}$ atoms/cm$^2$. The polysilicon layer, 5, can also be deposited using insitu doping procedures, by incorporating either arsine, or phosphine, into the silane flow. A first layer of tungsten silicide, 6, is next deposited, again via use of LPCVD procedures, at a temperature between about 420° to 600° C., to a thickness between about 1000 to 2000 Angstroms, using tungsten hexafluoride and silane as reactants. Finally a first insulator layer of silicon oxide, 7, is deposited using LPCVD or plasma enhanced chemical vapor deposition, (PECVD), procedures, at a temperature between about 400° to 800° C., to a thickness between about 700 to 3000 Angstroms, using tetraethylorthosilicate, (TEOS), as a source. Photolithographic and reactive ion etching, (RIE), procedures, using photoresist mask, 8, and using CHF$_3$ as an etchant for silicon oxide layer, 7, and Cl$_2$ as an etchant for both tungsten silicide layer, 6, and polysilicon layer, 5, are used to produce the first polycide gate structures shown in FIG. 2a, and in FIG. 2b. The first polycide gate structures shown in FIG. 2a, will be used as transfer gates for the subsequent DRAM devices, while FIG. 2b, shows the first polycide gate structures, on gate insulator, 3, to be used for the access transistor of the SRAM device structure, and also the first polycide gate structures, interfacing semiconductor substrate, 1, to be used for the buried contact structure of the SRAM device structure. Photoresist mask, 8, is removed via plasma oxygen ashing, and careful wet cleans.

Figure 3A:
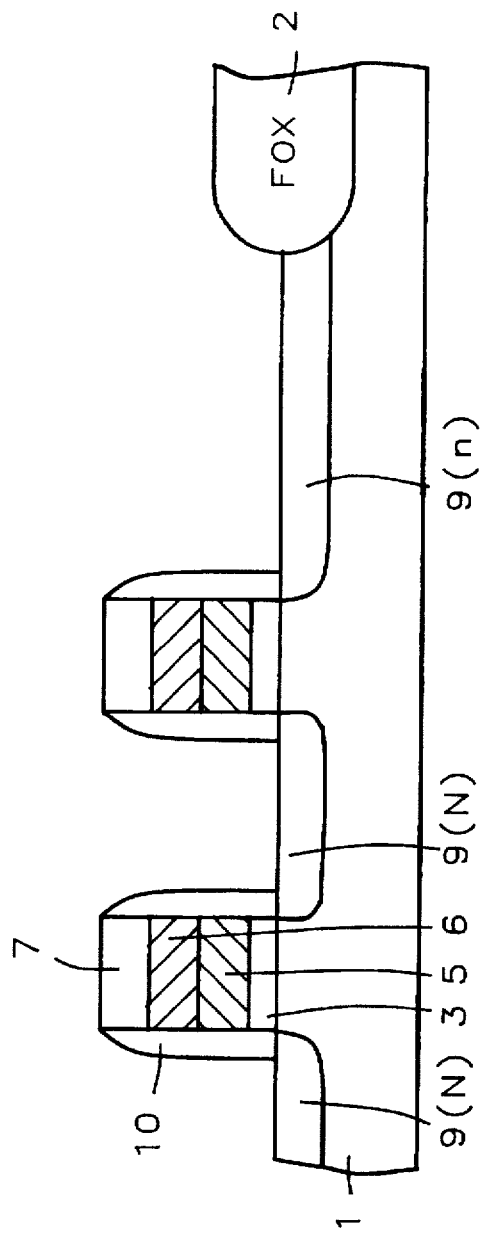
Figure 3B:
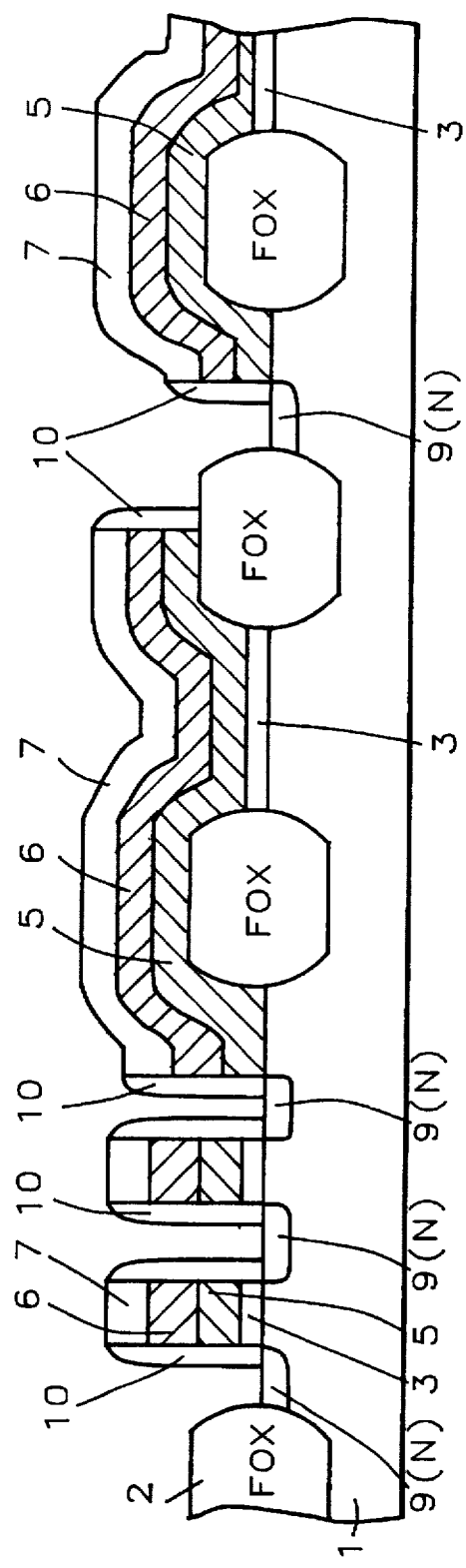

An ion implantation of phosphorous, at an energy between about 25 to 60 KeV, at a dose between about $5\times10^{12}$ to $5\times10^{13}$ atoms/cm$^2$, is used to produce lightly doped source and drain regions, 9, for the transfer gate transistors, for the DRAM device structure, shown in FIG. 3a, and for the access transistors of the SRAM device structure, shown in FIG. 3b. This implantation process also dopes the semiconductor substrate regions, not covered by first polycide gate structures, thus allowing for a conductive area for subsequent link up to a subsequent buried contact structure for the SRAM device structure, and a doped area for subsequent link up of a subsequent stacked capacitor structure for the DRAM device structure. A second insulator layer of silicon oxide, is next deposited using LPCVD or PECVD procedures, at a temperature between about 400° to 800° C., to a thickness between about 700 to 3000 Angstroms, using TEOS as a source. Anisotropic, RIE procedures are next employed to create insulator sidewall spacer, 10, shown schematically for the DRAM device structure, in FIG. 3a, and for the SRAM device structure, in FIG. 3b.

Figure 4A:
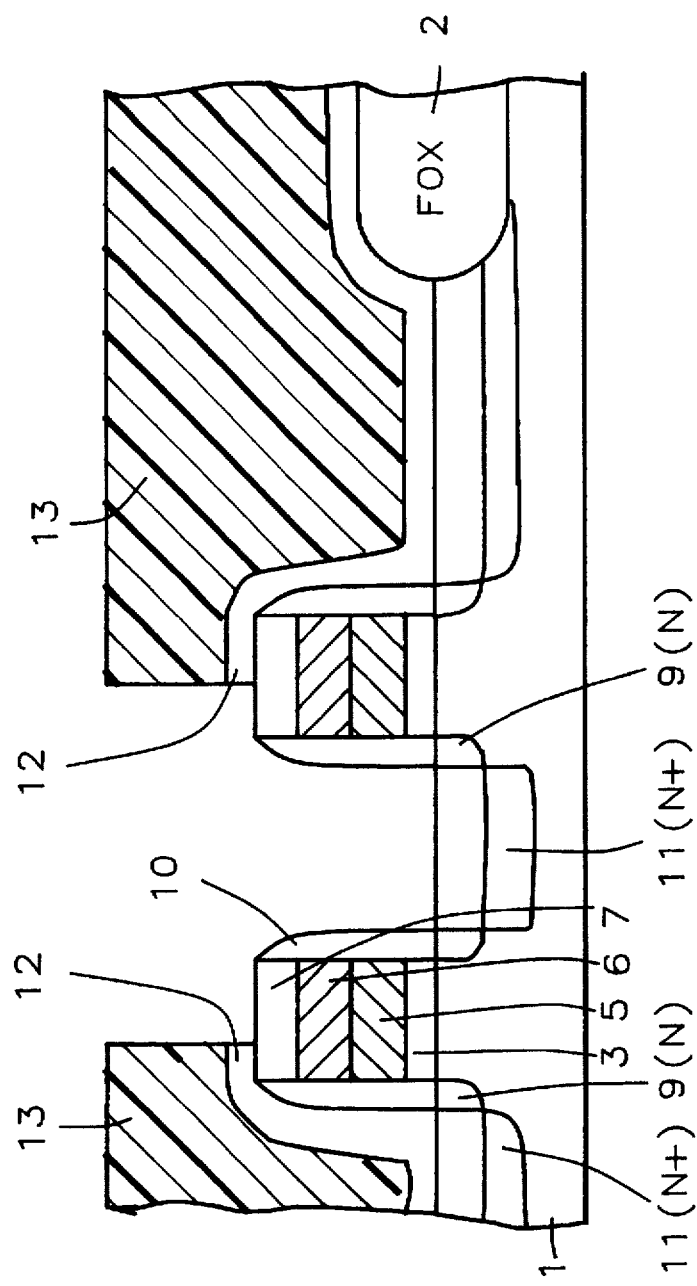
Figure 4B:
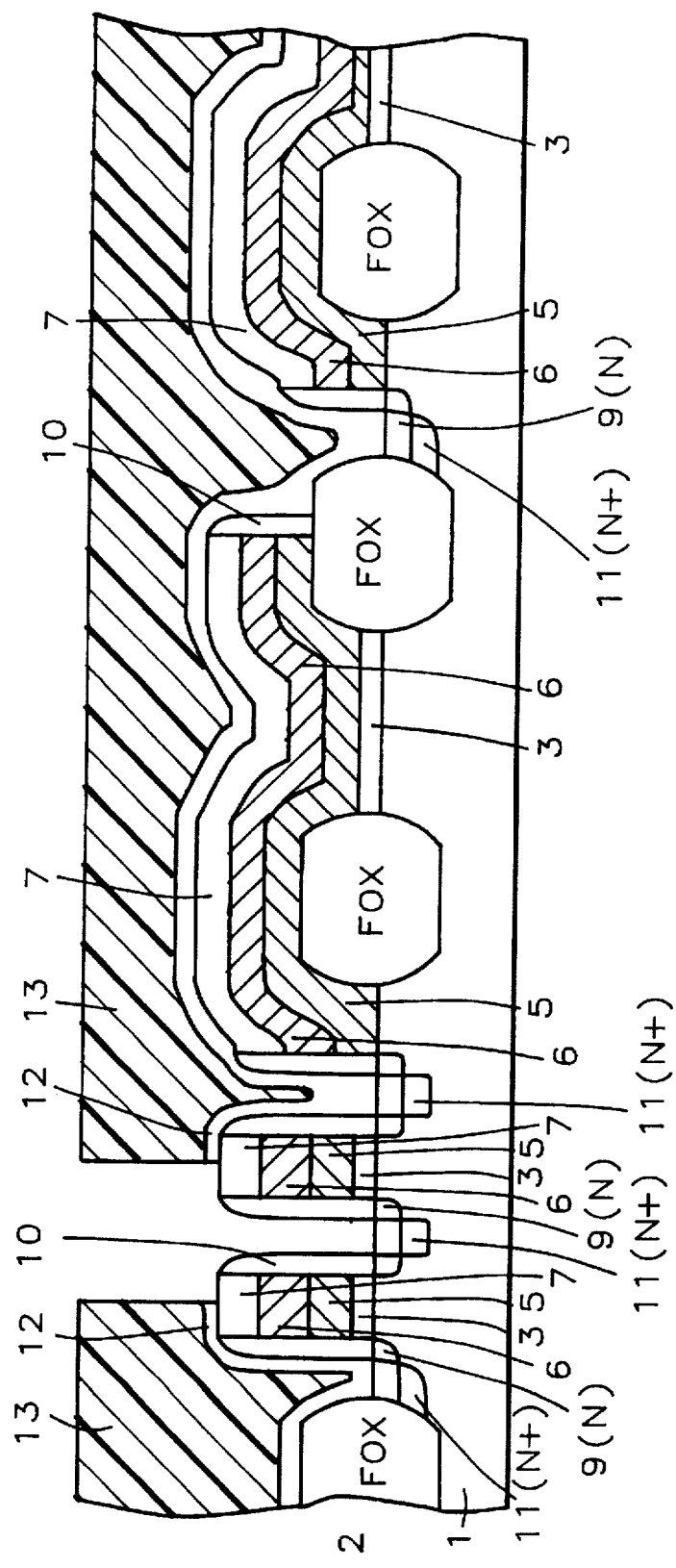

Another ion implantation procedure, using arsenic, is performed at an energy between about 35 to 100 KeV, at a dose between about $5 \times 10^{13}$ to $5 \times 10^{15}$ atoms/cm$^2$, and used to create heavily doped source and drain regions, 11, for the transfer gate transistors of the DRAM device structure, shown in FIG. 4a, and for the access transistors of the SRAM device structure shown in FIG. 4b. This implantation also increases the conductivity of the semiconductor substrate in the region which will be used for contact to a subsequent capacitor structure for the DRAM device structure, and for an area used to link up regions used for both devices. A third insulator layer of silicon oxide, 12, is deposited, again via use of either LPCVD or PECVD procedures, at a temperature between about 400° to 800° C., to a thickness between about 700 to 3000 Angstroms, using TEOS as a source. Photolithographic procedures are used to form photoresist mask, 13, which in turn is used as a mask to allow removal of silicon oxide layer, 12, via the use of RIE procedures, using CHF$_3$ as an etchant. The removal of silicon oxide layer, 12, from the surface of semiconductor substrate, 1, between transfer gate transistors of the DRAM device structure, shown in FIG. 4a, and from the surface of semiconductor substrate, 1, from between access transistors of the SRAM device structure, shown in FIG. 4b, will allow subsequent contact to semiconductor substrate, 1, to be easily formed. Photoresist mask, 13, is removed using plasma oxygen ashing, followed by careful wet cleans.

Figure 5A:
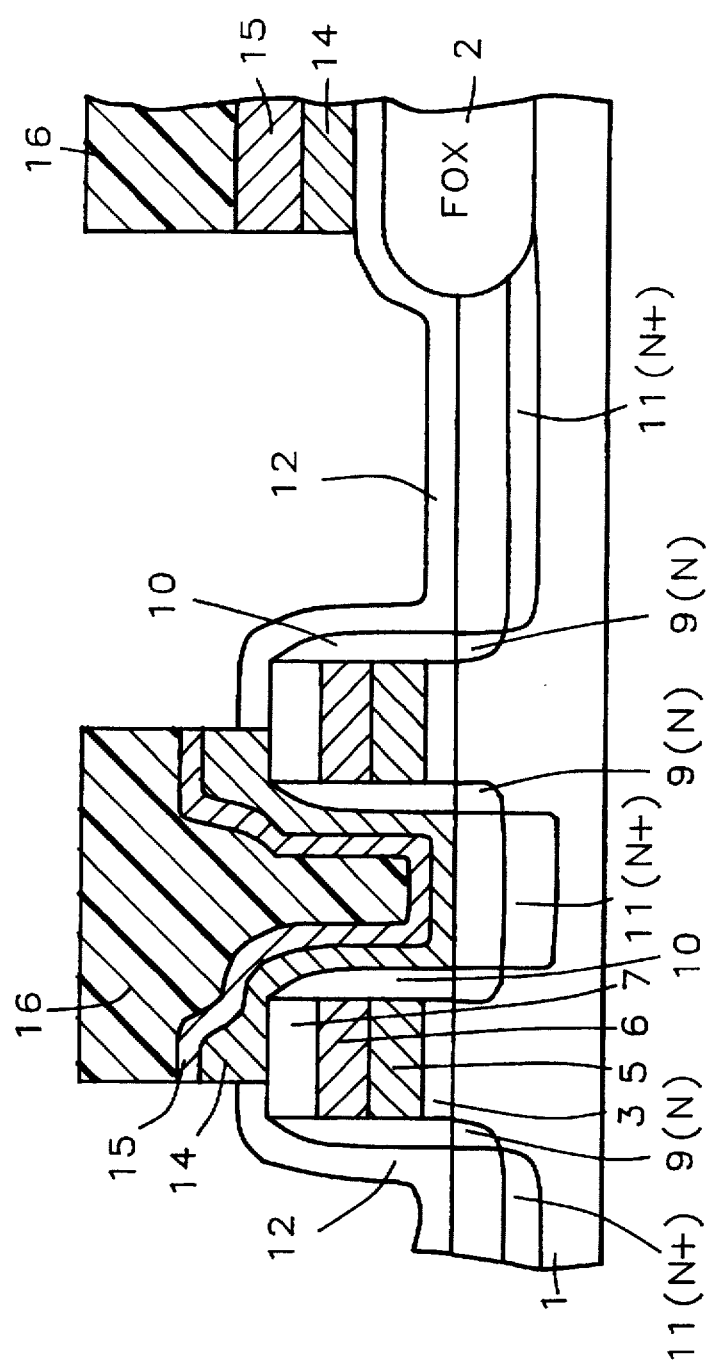
Figure 5B:
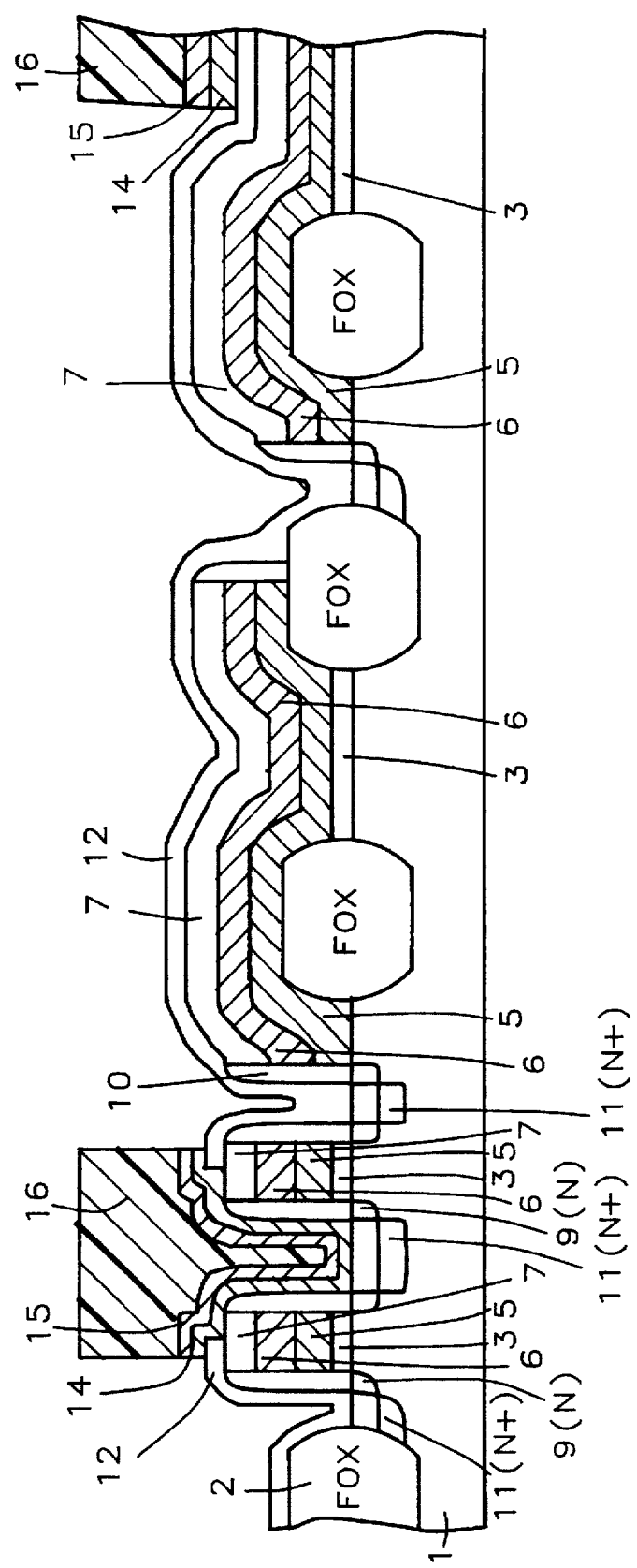

FIG. 5a, and FIG. 5b, show the creation of a second polycide gate structure, self-aligned to, and contacting, semiconductor substrate, 1, between transfer gate transistors of the DRAM device structure, (FIG. 5a), and between access transistors of the SRAM device structure, (FIG. 5b). A second layer of polysilicon, 14, is deposited using LPCVD procedures, at a temperature between about 480° to 620° C., to a thickness between about 500 to 1500 Angstroms. The polysilicon layer is again doped via an ion implantation procedure using either arsenic or phosphorous, at an energy between about 30 to 80 KeV, at a dose between about $5 \times 10^{13}$ to $5 \times 10^{15}$ atoms/cm$^2$. The polysilicon layer can also be deposited using insitu doped procedures by incorporation of either arsine or phosphine into the silane ambient. A second tungsten silicide layer, 15, is next deposited, again using LPCVD processing, at a temperature between about 420° to 600° C., to a thickness between about 1000 to 2000 Angstroms. Photoresist mask, 16, is used to allow the formation of the second polycide gate structure to occur, via the use of RIE procedures, using Cl$_2$ as an etchant. In addition to the self-aligned, second polycide gate structures, dummy structures of tungsten silicide, 15, on polysilicon, 14, are also created on the FOX region, 2, of the DRAM device structure, shown schematically in FIG. 5a, and on the buried contact structure of the SRAM device structure, shown schematically in FIG. 5b. Plasma oxygen ashing, and careful wet cleans, are used to remove photoresist mask, 16.

Figure 6A:
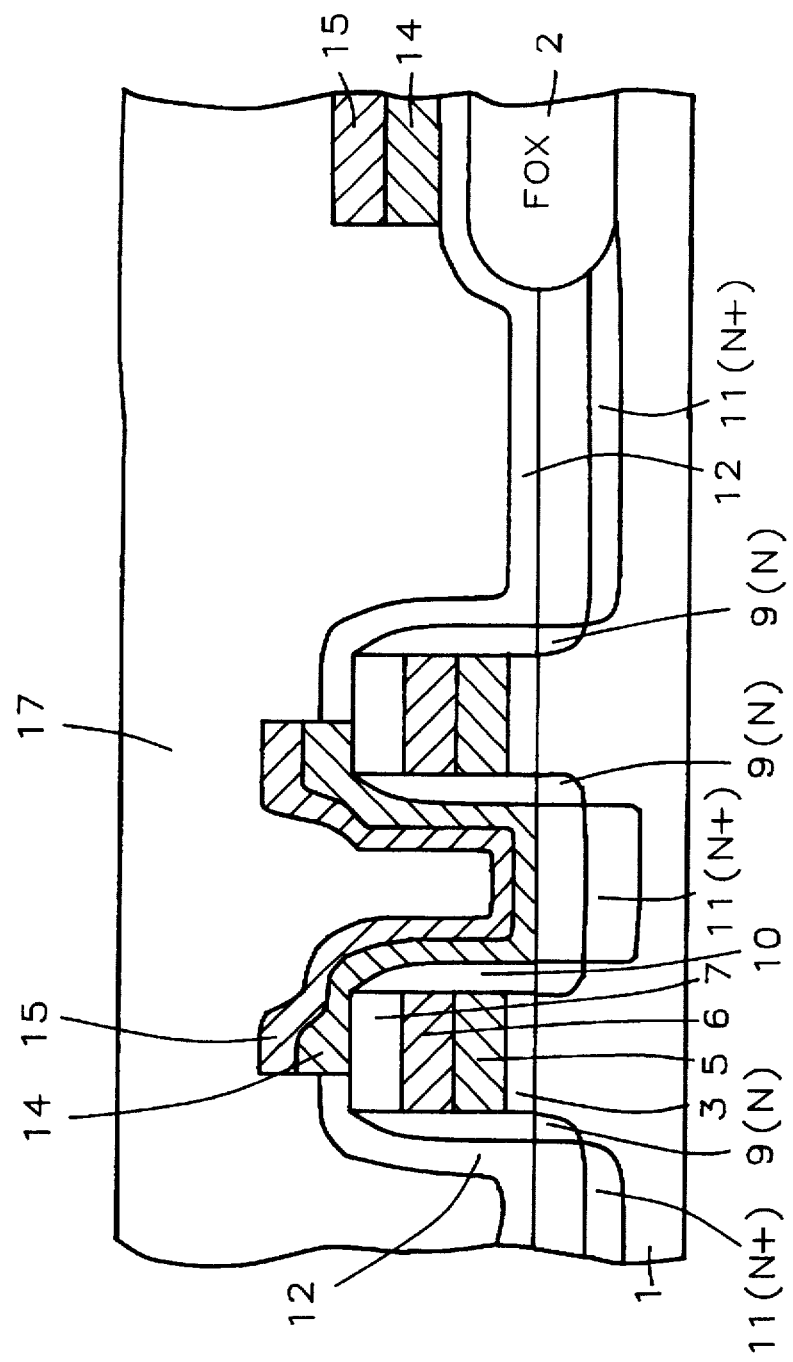
Figure 6B:
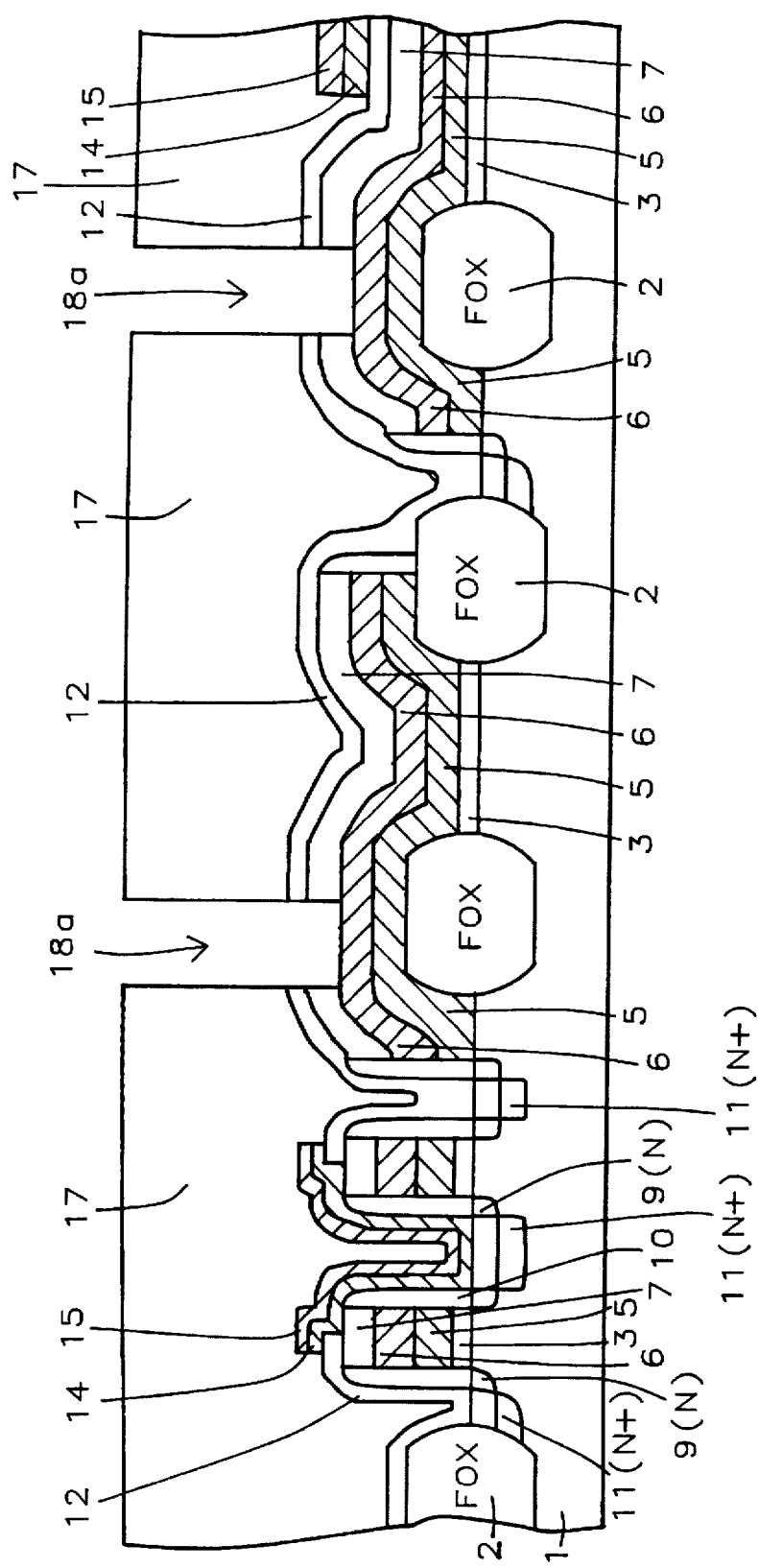
Figure 7A:
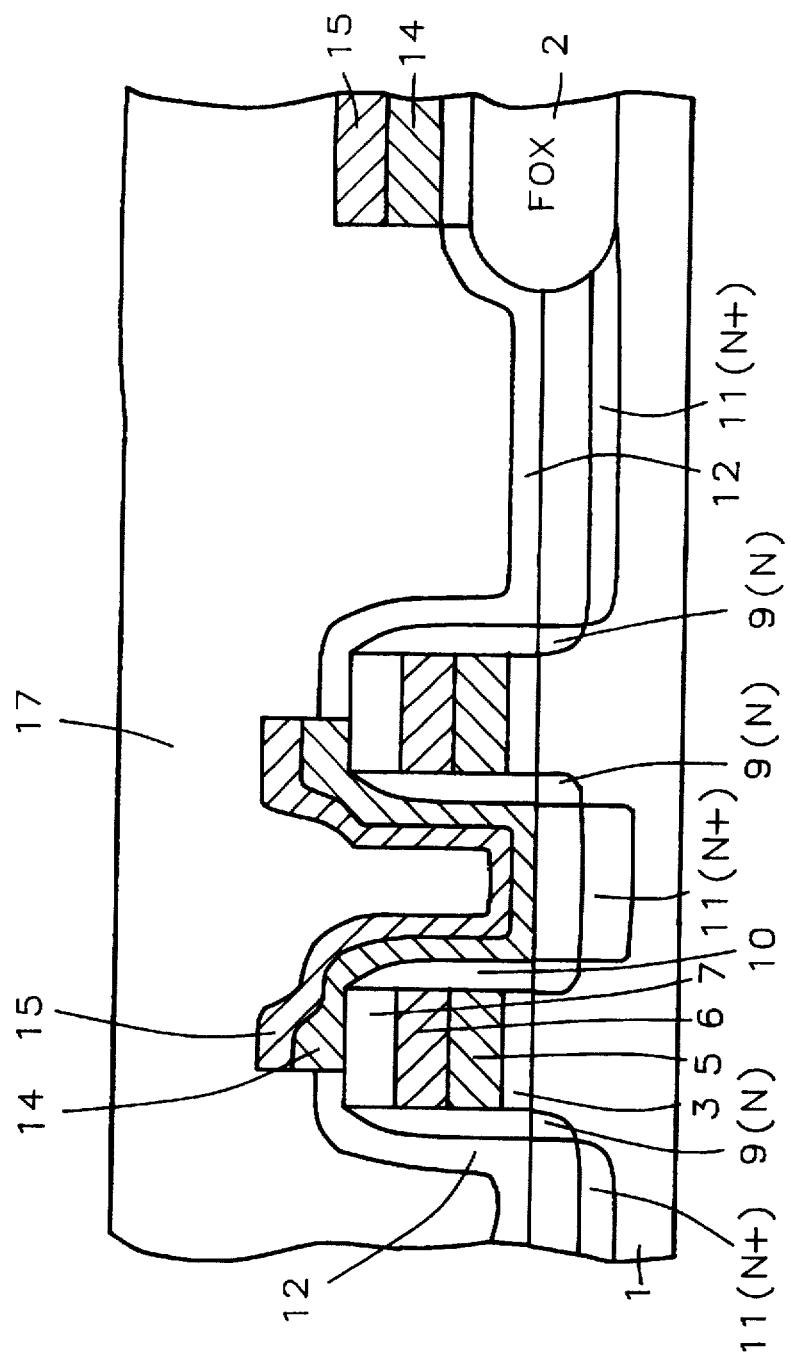
Figure 7B:
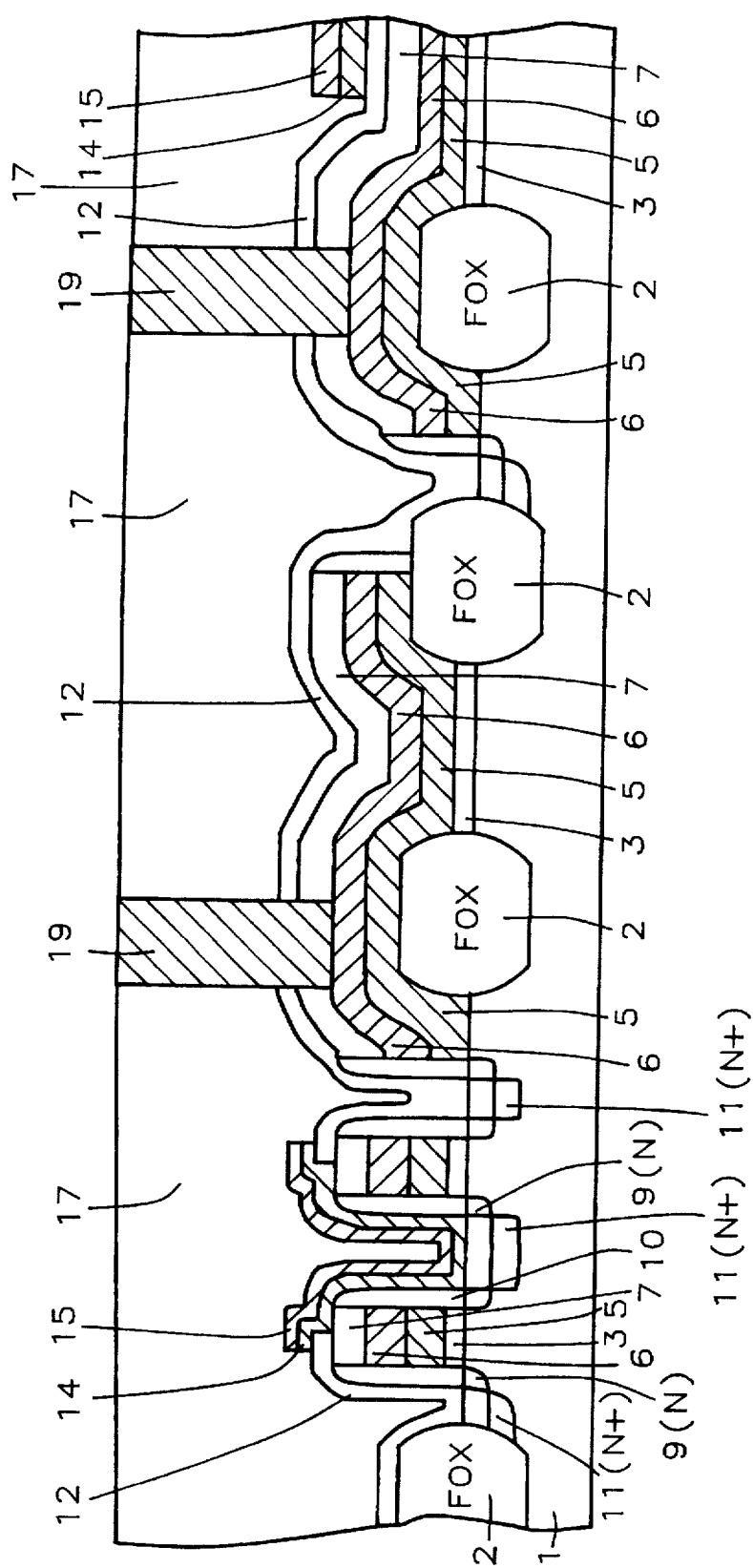

A fourth insulator layer of silicon oxide, 17, is deposited using LPCVD or PECVD processes, at a temperature between about 400° to 800° C., to a thickness between about 10000 to 25000 Angstroms. Silicon oxide layer, 17, is next subjected to a chemical mechanical polishing procedure, to create a planar topography, resulting in the thickness of polished, silicon oxide layer, of between about 5000 to 10000 Angstroms. This is shown schematically in FIGS. 6a, and 6b. A photoresist pattern, not shown, is used as a mask to allow contact holes, 18a, to be opened in planarized silicon oxide layer, 17, silicon oxide layer, 12, and silicon oxide layer, 7, exposing the top surface of the first polycide gate structure, used for subsequent substrate contact for the buried contact structure of the SRAM device structure. Contact hole 18a, shown schematically in FIG. 6b, was opened using RIE procedures, with CHF$_3$ used as an etchant. Photoresist removal is again accomplished via plasma oxygen ashing,and careful wet cleans. A third layer of polysilicon is next deposited, using LPCVD procedures, at a temperature between about 480° to 620° C., to a thickness between about 5000 to 10000 Angstroms, adding either phosphine or arsine to the ambient for insitu doping purposes, and completely filling contact holes, 18a. Polysilicon is next cleared from unwanted regions by use of either chemical mechanical polishing procedures, or via use of RIE, using Cl$_2$ as an etchant. This procedure results in the creation of polysilicon plug, 19, in contact holes, 18a, of the SRAM device structure, shown schematically in FIG. 7b.

Figure 8A:
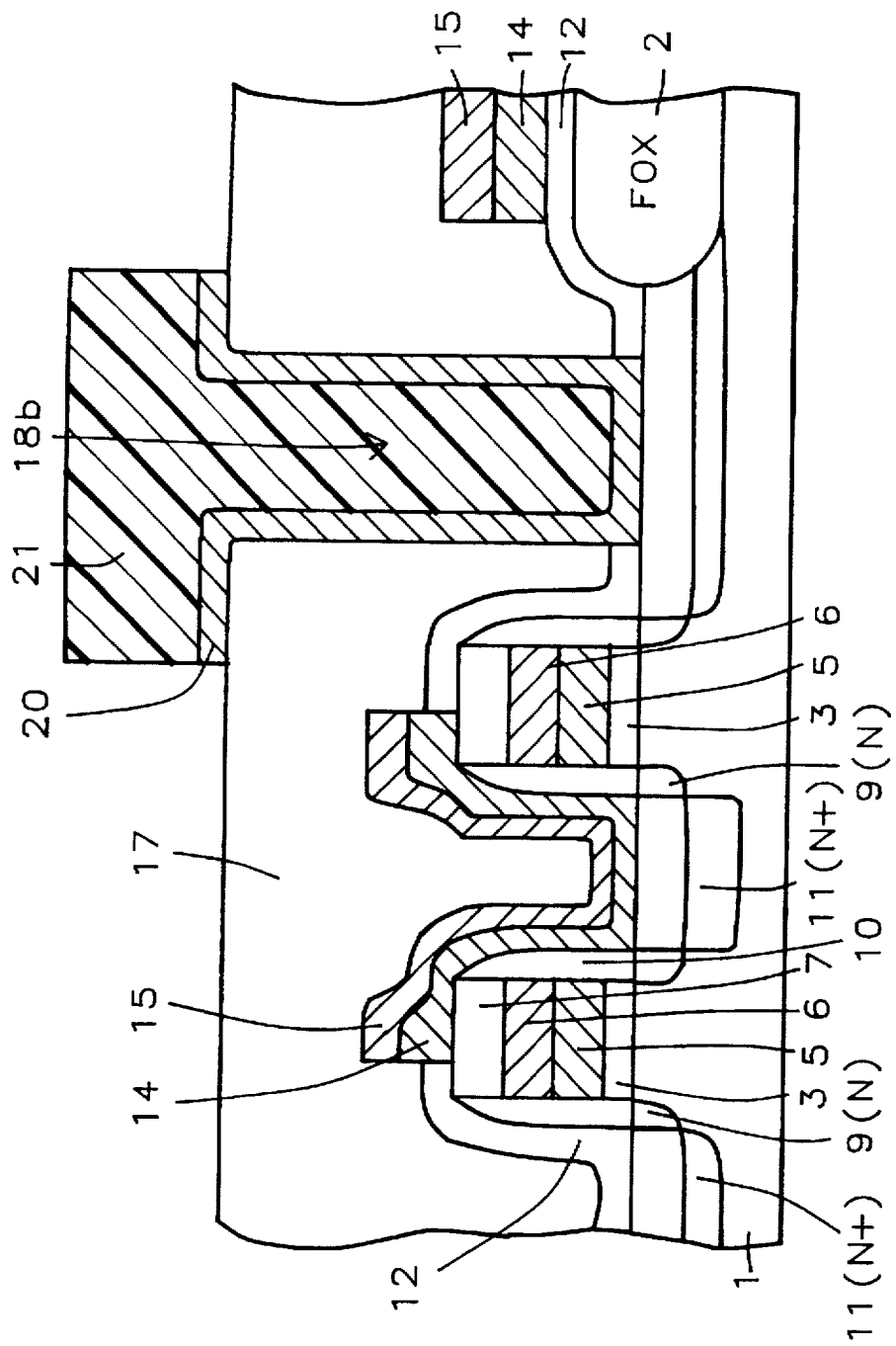
Figure 8B:
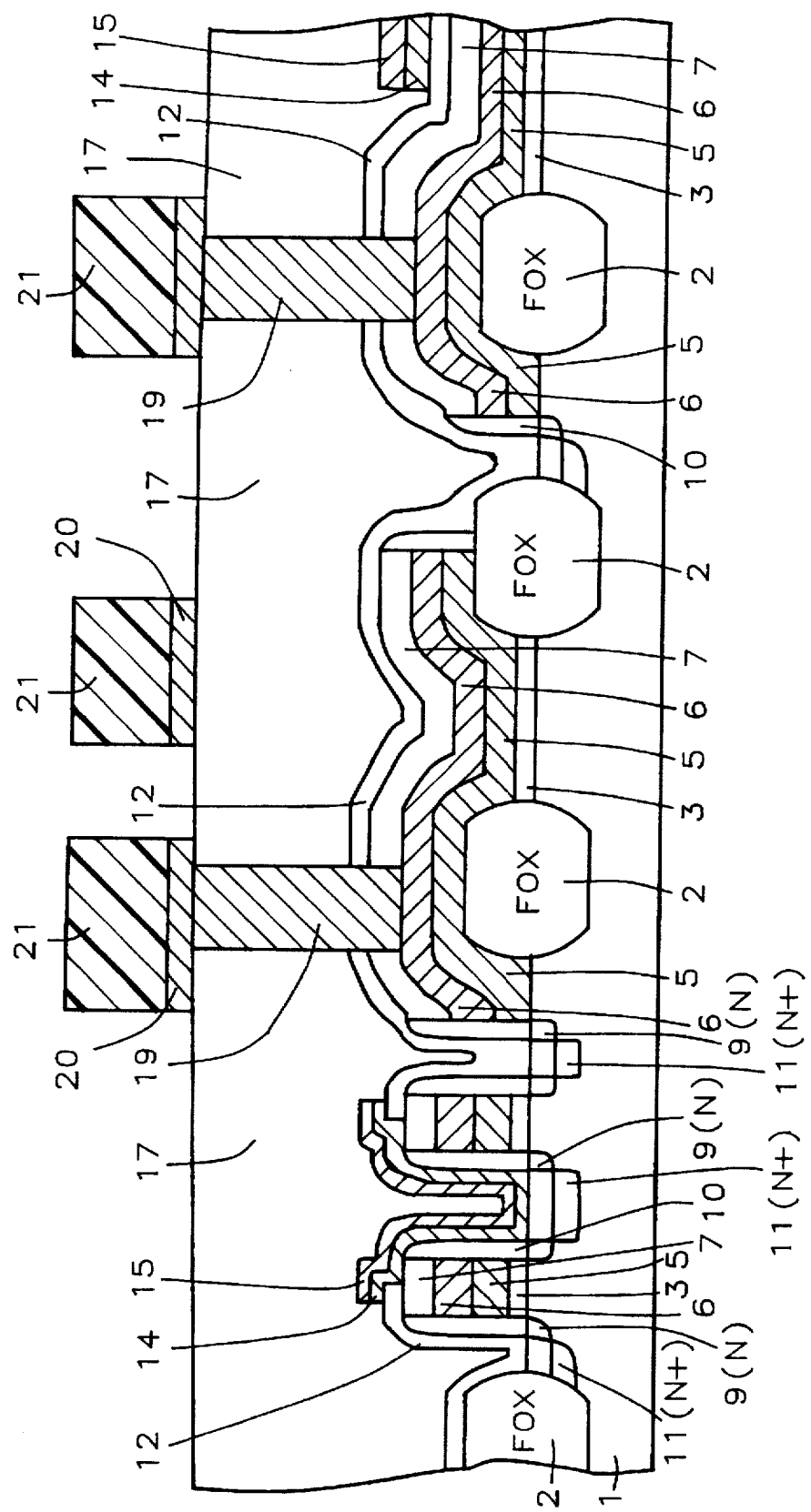

A contact hole, 18b, is next formed for the DRAM device structure, and shown in FIG. 8a. A photoresist pattern, not shown, is used as a mask to open contact hole, 18b, in silicon oxide layer, 17, and in silicon oxide layer 12, exposing the surface of heavily doped region, 11, in semiconductor substrate, 1. Contact hole, 18b, was formed using RIE procedures, with CHF$_3$ used as an etchant. Photoresist is then removed using plasma oxygen ashing and careful wet cleans. A fourth polysilicon layer, 20, is next deposited using LPCVD processing, at a temperature between about 480° to 620° C., to a thickness between about 500 to 1500 Angstroms, again using insitu doping via incorporation of either arsine or phosphine to the silane ambient. A photoresist mask, 21, is formed and used to define the polysilicon bottom capacitor electrodes, via RIE, using Cl$_2$ as an etchant. The bottom capacitor electrode lines the sides of contact hole 18b, for the DRAM device structure, shown schematically in FIG. 8a. For the SRAM device structure, shown schematically in FIG. 8b, the bottom capacitor electrode, formed from polysilicon layer, 20, overlies the polysilicon plug, 19, in contact holes, 18a. Another bottom capacitor electrode resides between polysilicon plug filled, contact holes, 18a, overlying planarized silicon oxide layer, 17. Photoresist mask, 21, is then removed using plasma oxygen ashing, followed by careful wet cleans.

Figure 9A:
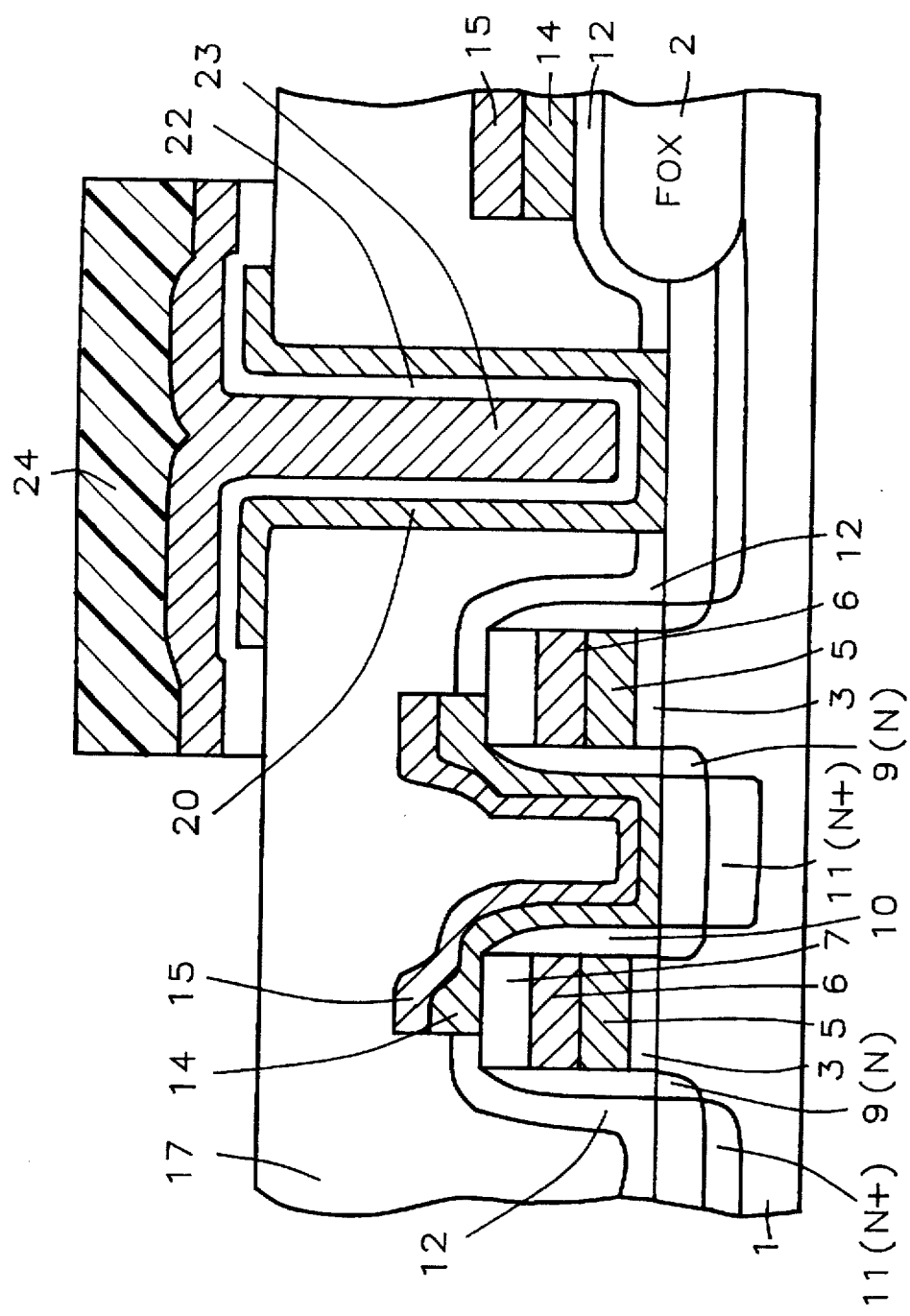
Figure 9B:
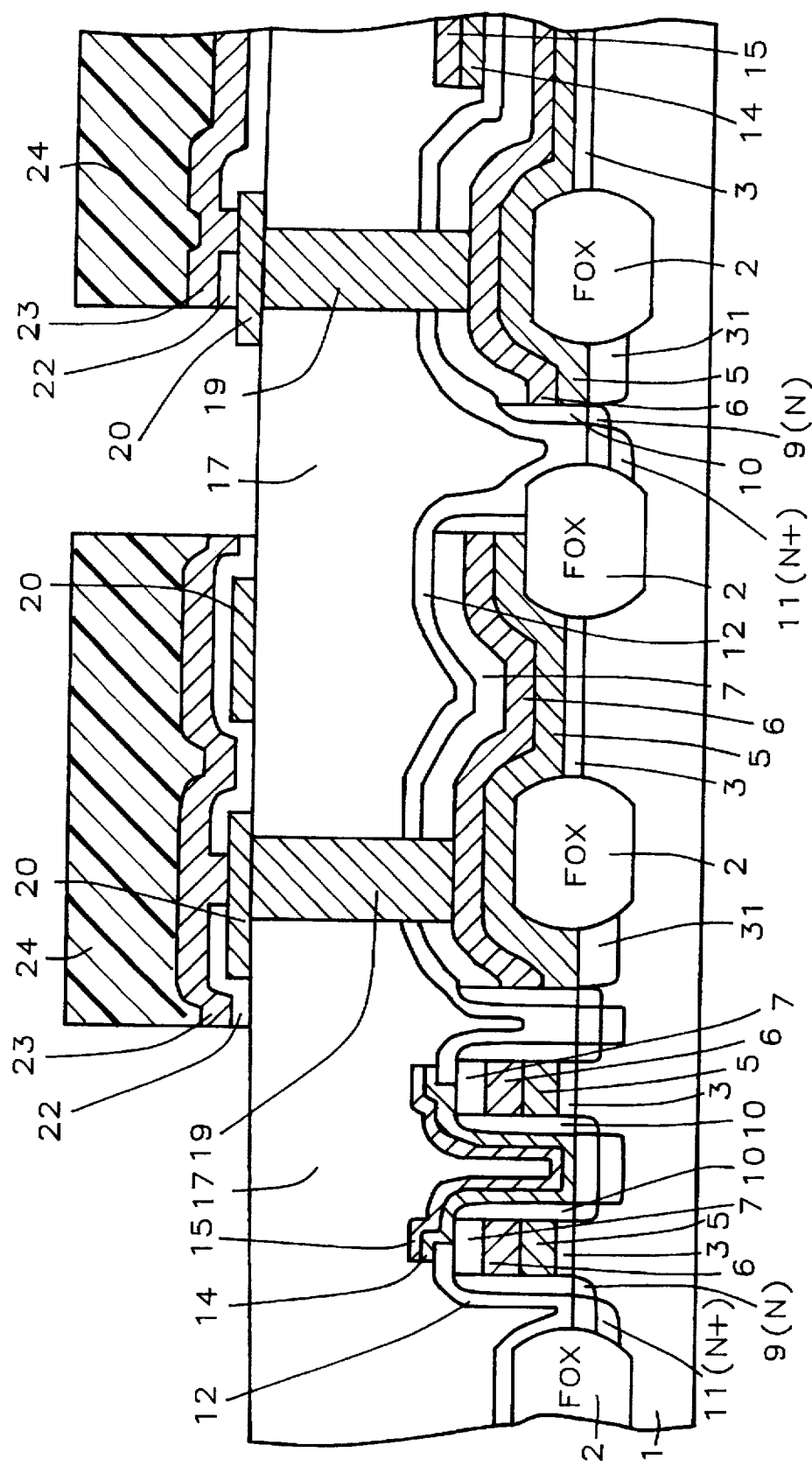

A capacitor dielectric layer, 22, is next addressed. A native silicon dioxide layer is formed, at a temperature between about 20° to 25° C., at a thickness between about 7 to 25 Angstroms, on the surface of the bottom capacitor electrode, created from polysilicon layer, 20. A thin layer of silicon nitride is then deposited, using LPCVD processes, at a temperature between about 650° to 850° C., to a thickness between about 40 to 100 Angstroms. A thermal oxidation is next performed at a temperature between about 700° to 900°, in an oxygen-steam ambient, to convert the silicon nitride layer to a silicon oxynitride layer. The thickness of this thin composite, capacitor dielectric layer, 22, shown schematically in FIGS. 9a, and 9b, is equivalent to between about 30 to 80 Angstroms, of silicon dioxide. The capacitor dielectric layer, 22, is next subjected to a photolithographic procedure, used to create a photoresist mask, (not shown), allowing RIE processing, using CHF$_3$ as an etchant, to remove capacitor dielectric layer, 22, in only regions of the capacitor dielectric layer, 22, that will be used for TFT portion of the SRAM device structure, exposing the top surface of bottom capacitor electrode, created from polysilicon layer, 21. This is schematically illustrated in FIG. 9b. After photoresist removal, using plasma oxygen ashing and careful wet cleans, a fifth polysilicon layer, 23, is deposited, using LPCVD processing, at a temperature between about 460° to 620° C., and to a thickness between about 300 to 2500 Angstroms. Polysilicon layer, 23, is doped either via the use of insitu doping procedures, or grown intrinsically and subjected to an ion implantation procedure, using arsenic or phosphorous, at an energy between about 25 to 80 KeV, at a dose between about $5\times10^{13}$ to $5\times10^{15}$ atoms/cm$^2$. The deposition of polysilicon layer, 23, completely fills contact hole, 18b, for the DRAM device structure, shown in FIG. 9a. A photoresist mask, 24, and RIE procedures, using Cl$_2$ as an etchant, are used to define the upper capacitor plate, created from polysilicon layer, 23, and shown schematically for the DRAM device structure, in FIGS. 9a, and for the TFT-SRAM device structure, in FIG. 9b. Also shown in FIG. 9b, is a region of out diffusion, 31, from polysilicon layer, 5, of the first polycide gate structure. This region had already been forming during previous process steps, and allows link up between the capacitor structure of the TFT-SRAM, and the access transistors of the SRAM, to occur. This is illustrated in FIG. 9b. Removal of photoresist mask, 24, is performed using plasma oxygen ashing and careful wet cleans.

Figure 10A:
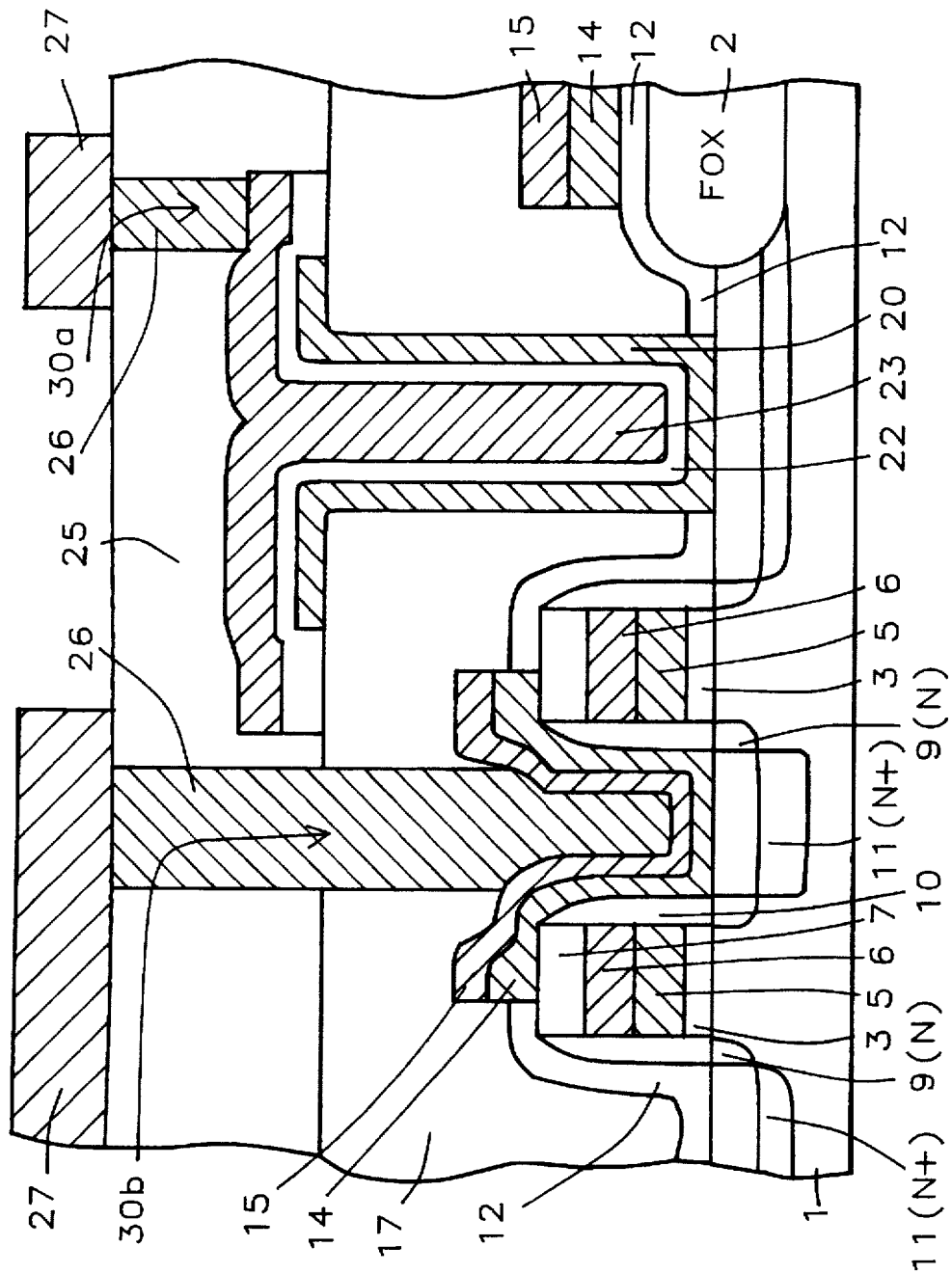
Figure 10B:
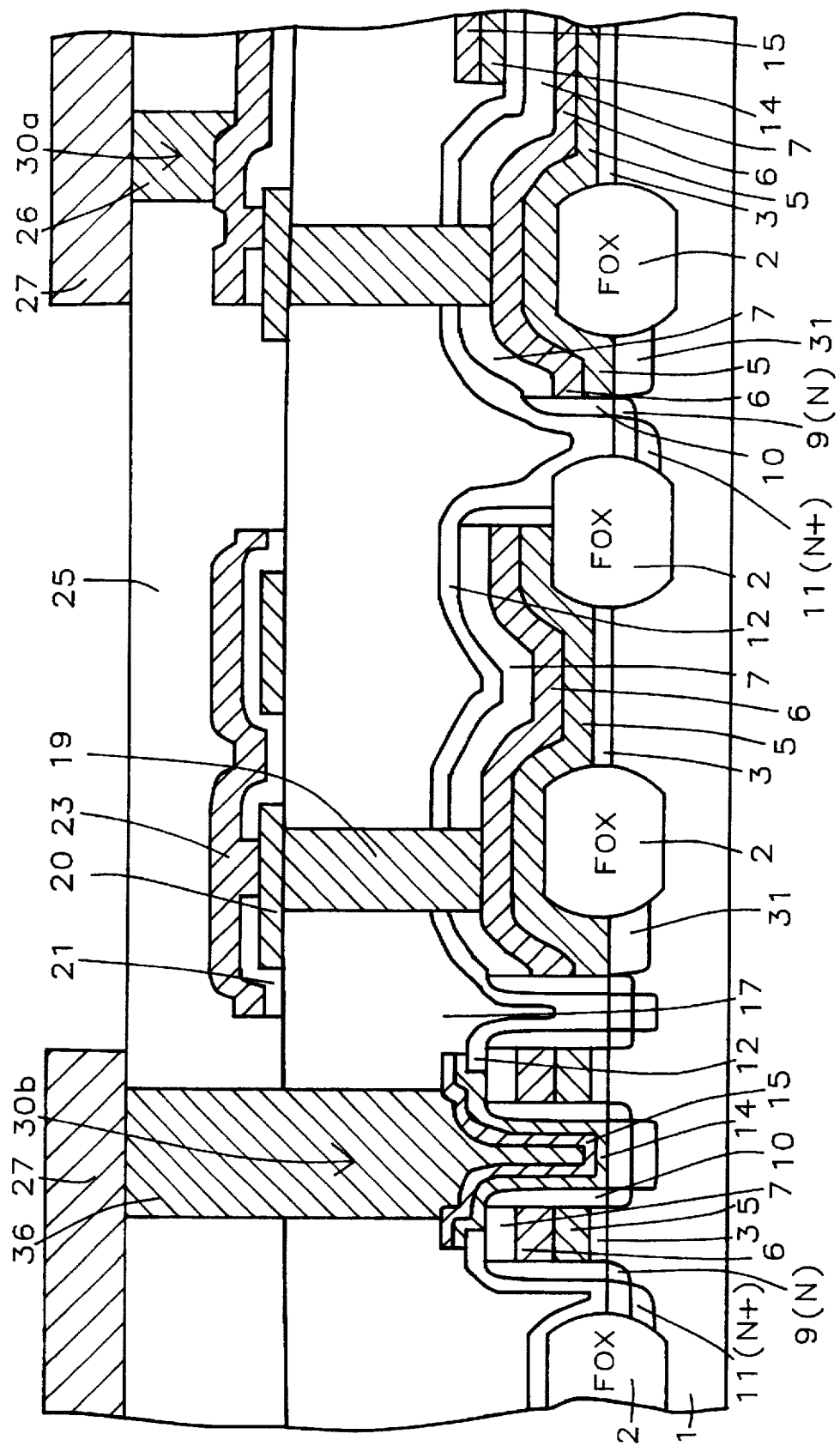

FIGS. 10a, and 10b, illustrate the deposition of a fifth insulator layer of silicon oxide, 25, using LPCVD or PECVD processes, at a temperature between about 400° to 800° C., to a thickness between about 4000 to 8000 Angstroms. Silicon oxide layer, 25, is planarized using chemical mechanical polishing procedures, resulting a planar topography. A photoresist pattern, (not shown), is used as a mask to create via holes, 30a, in silicon oxide layer, 25, and also to create via holes, 30b, in a composite layer of silicon oxide layer, 25, and silicon oxide layer, 17. The vias are created using RIE procedures, with CHF$_3$ used as the selective etchant. Via holes, 30a, between about 4000 to 8000 Angstroms in depth, expose the surface of the upper capacitor electrode, for the DRAM device structure, shown in FIG. 10a, while via hole 30a, exposes the upper capacitor electrode for the TFT-SRAM device structure, shown schematically in FIG. 10b. The deeper via holes, 30b, between about 9000 to 18000 Angstroms in depth, expose the transfer gate transistor of the DRAM device structure, shown in FIG. 10a, and the access transistor of the SRAM device structure shown in FIG. 10b. The use of the selective etchant CHF$_3$ allows the deeper via holes, 30b, to be etched, without attacking the upper capacitor electrodes, already exposed in via holes, 30a. Photoresist removal is accomplished using plasma oxygen ashing and careful wet cleans.

A deposition of tungsten is performed using LPCVD processing, at a temperature between about 420° to 500° C., to a thickness between about 4000 to 7000 Angstroms, using tungsten hexafluoride as a source, and completely filling via holes, 30a, as well as via holes, 30b. The unwanted regions of tungsten is removed from non-via hole regions, using either RIE, with Cl$_2$ used as the etchant, or by chemical mechanical polishing, in either case resulting in tungsten plugs, 26, embedded in via holes, 30a and via holes, 30b. This is schematically shown in FIG. 10a and FIG. 10b. A metal layer of aluminum, containing between about 0.5 to 3.0% copper, is deposited, using r.f. sputtering procedures, followed by photoresist patterning, (not shown), and RIE procedures, using Cl$_2$ as an etchant, producing metal contact structures, 27, for both DRAM and SRAM device structures, shown schematically in FIGS. 10a and 10b. Photoresist removal is once again accomplished via plasma oxygen ashing and careful wet cleans.

While this invention has been particularly shown and described with reference to, the preferred embodiments thereof, it will be understood by those skilled in the art that various changes in form and details may be made without departing from the spirit and scope of this invention.

What is claimed is:

1. A stacked capacitor DRAM structure, and a thin film transistor SRAM structure, on a single semiconductor substrate, comprising:

field oxide regions on the surface of said semiconductor substrate;

device regions for said DRAM structure, and for said SRAM structure, between said field oxide regions;

two, first polycide gate structures on underlying gate oxide, on said device region of said DRAM structure;

two, said first polycide gate structures on said underlying gate oxide, on said device region of said SRAM structure;

a buried contact structure, for said SRAM structure, partially overlying said underlying gate oxide, and partially overlying said semiconductor substrate;

a second polycide gate structure contacting said semiconductor substrate, between said two, first polycide gate structures, of said DRAM structure;

said second polycide gate structure contacting said semiconductor substrate, between said two, first polycide gate structures, of said SRAM structure;

a first insulator layer, with a contact hole filled with a capacitor structure, contacting said semiconductor substrate, and adjacent to said first polycide gate, of said DRAM structure;

said first insulator layer, with contact holes filled with polysilicon, contacting top surface of said buried contact structure of said SRAM structure;

a thin film transistor structure, on top surface of said first insulator layer, and contacting said polysilicon, in said contact hole, of said SRAM structure;

a first via hole in an overlying second insulator layer, and in an underlying said first insulator layer, and filled with tungsten, contacting top surface of said second polycide gate structure, of said DRAM structure;

said first via hole in said overlying second insulator layer, and in underlying said first insulator layer, and filled with tungsten, contacting top surface of said second polycide gate structure, of said SRAM structure;

a second via hole in said second insulator layer, filled with tungsten, and contacting top surface of said capacitor structure, of said DRAM structure;

said second via hole in said second insulator layer, filled with tungsten, and contacting top surface of said thin film transistor structure, of said SRAM structure; and metal contact structures to said tungsten filled via holes.

2. The DRAM and SRAM structures of claim 1, wherein said first polycide gate structures are comprised of an underlying polysilicon layer, at a thickness between about 500 to 1500 Angstroms, and an overlying tungsten silicide layer, at a thickness between about 1000 to 2000 Angstroms.

3. The DRAM and SRAM structures of claim 1, wherein said second polycide gate structure is comprised of an underlying polysilicon layer, at a thickness between about 500 to 1500 Angstroms, and an underlying tungsten silicide layer, at a thickness between about 1000 to 2000 Angstroms.

4. The SRAM structures of claim 1, wherein said buried contact structure, is comprised of an underlying layer of polysilicon, at a thickness between about 500 to 1500 Angstroms, and an overlying layer of tungsten silicide, at a thickness between about 1000 to 2000 Angstroms.

5. The SRAM structure of claim 1, wherein said thin film transistor is composed of an overlying polysilicon layer, a capacitor dielectric layer of silicon oxynitride-silicon dioxide, and an underlying polysilicon layer.

6. The DRAM structure of claim 1, wherein said capacitor structure, in said contact hole, is filled with an overlying polysilicon layer, a capacitor dielectric composite layer of silicon oxynitride-silicon dioxide, and an underlying polysilicon layer.

* * * * *